United States Patent [19]

Ono et al.

[11] Patent Number: 5,138,571
[45] Date of Patent: Aug. 11, 1992

[54] METHOD FOR TRANSFERRING A BLOCH LINE

[75] Inventors: Takeo Ono, Atsugi; Hitoshi Oda, Yokohama; Fumihiko Saito, Sagamihara; Akira Shinmi, Yokohama, all of Japan

[73] Assignee: Canon Kabushiki Kaisha, Tokyo, Japan

[21] Appl. No.: 758,209

[22] Filed: Sep. 12, 1991

Related U.S. Application Data

[63] Continuation of Ser. No. 515,323, Apr. 30, 1990, abandoned, which is a continuation of Ser. No. 211,927, Jun. 27, 1988, abandoned.

[30] Foreign Application Priority Data

Jul. 2, 1987 [JP] Japan .................. 62-163925

[51] Int. Cl.$^5$ .................. G11B 5/00; G11C 19/08
[52] U.S. Cl. .................. 365/87; 365/29
[58] Field of Search .................. 365/29, 87, 157

[56] References Cited

U.S. PATENT DOCUMENTS

| 4,060,798 | 11/1977 | Schloemann et al. | 365/25 |
| 4,583,200 | 4/1986 | Konishi et al. | 365/29 |

FOREIGN PATENT DOCUMENTS

| 3542279 | 6/1986 | Fed. Rep. of Germany | 365/87 |
| 59-96592 | 6/1984 | Japan | 365/87 |
| 59-098384 | 6/1984 | Japan . | |
| 60-76079 | 4/1985 | Japan | 365/87 |
| 1401517 | 6/1988 | U.S.S.R. . | |

OTHER PUBLICATIONS

IEEE Transactions on Magnetics, "Chip Organization of Bloch Line Memory", T. Suzuki et al., vol. 22, No. 5, Sep. 1986, pp. 784–89.
AIP Conference Proceeding, Magnetism and Magnetic Materials, "Magnetostrictive-Piezoelectric Bubble Detectors", W. Ishak et al., No. 24, pp.558–59, 1974.
Journal of Applied Physics, "Interaction of Domain Walls with Localized Stress Fields in Magnetostrictive Films", J. Dishman et al., vol. 45, No. 9, Sep. 1974, pp.4076–83.

*Primary Examiner*—Joseph A. Popek
*Attorney, Agent, or Firm*—Fitzpatrick, Cella, Harper & Scinto

[57] ABSTRACT

Method for transferring the Bloch line present in the magnetic wall of the magnetic domain formed in the magnetic thin film, along the magnetic wall is characterized by the steps of forming a predetermined stress distribution along the magnetic wall in the magnetic thin film, positioning the Bloch line to a predetermined position in the magnetic wall in accordance with the stress distribution, and applying a pulsive magnetic field normally to a film plane of the magnetic thin film in synchronism with the formation of the stress distribution. The Bloch line is transferred from the predetermined position to another position by the stress distribution formation step and the magnetic field application step.

20 Claims, 4 Drawing Sheets

METHOD FOR TRANSFERRING A BLOCH LINE

This application is a continuation of application Ser. No. 07/515,323 filed Apr. 30, 1990, now abandoned, which is a continuation of application Ser. No. 07/211,927 filed Jun. 27, 1988, now abandoned.

BACKGROUND OF THE INVENTION

1. Field of the Invention

The present invention relates to a method for transferring a Bloch line which is present in a magnetic wall of a magnetic domain formed in a magnetic thin film, along the magnetic wall.

2. Related Background Art

As computer external memory, electronic file memory and still image file memory, various memory devices such as magnetic tape, winchester disk, floppy disk, optical disk, opto-magnetic disk and magnetic bubble memory have been used. Of those memory devices, the memories excluding the magnetic bubble memory require to move recording/reproducing heads relative to the memories to record and reproduce information. As the head is relatively moved, an information train can be fixedly recorded on an information track by the head or reproduce the information train fixedly recorded on the information track.

As a higher recording density has been required in recent years, tracking control to cause the head to exactly follow the information track becomes complex. When the tracking control is insufficient, a quality of a recorded or reproduced signal is lowered. Further, the quality of the recorded or reproduced signal is lowered by vibration of a head drive mechanism or dusts deposited on a surface of a recording medium. In a memory device which records and reproduces information while the head is in contact with a magnetic tape or other recording medium, abrasion occurs due to the slide. In a non-contact type recording/reproducing memory device such as an optical disk, a high precision focusing control is required, and if the control is insufficient, the quality of the recorded/reproduced signal is lowered.

As disclosed in U.S. patent application Ser. No. 125,824 filed Nov. 23, 1987 which is a continuation of U.S. patent application Ser. No. 801,401 filed Nov. 25, 1985, now abandoned and filed by the assignee of the present application, a magnetic bubble memory can record information at a predetermined position, transfer the recorded information, and reproduce the information at a predetermined position while the information is transferred. In recording and reproducing information, no relative movement of the head is required. Accordingly, the above problems are not encountered even if the recording density is increased, and a high reliability is attained.

In the magnetic bubble memory, a circular magnetic domain (bubble) generated by the application of a magnetic field to a magnetic thin film having an easy axis of magnetization perpendicular to a film plane of a magnetic garnet film or the like is used as an information bit. Accordingly, even if a minimum bubble (diameter 0.3 μm) as restricted by a currently available garnet film material characteristic is used, a recording density of several tens M bits/cm² is a limit and a higher density is difficult to attain.

Recently, a Bloch line memory which has a higher recording density than the limit recording density of the magnetic bubble memory has been noticed. As disclosed in U.S. Pat. No. 4,583,200, the Bloch line memory uses a pair of Neil magnetic wall structures (Bloch lines) between Bloch magnetic wall structures around a magnetic domain generated in a magnetic thin film, as an information bit. Accordingly, it can attain as almost ten times high recording density as that of the magnetic bubble memory. For example, when a garnet film having a bubble diameter of 0.5 μm is used, a recording density of 1.6 G bits/cm² is attained.

Figure 1:
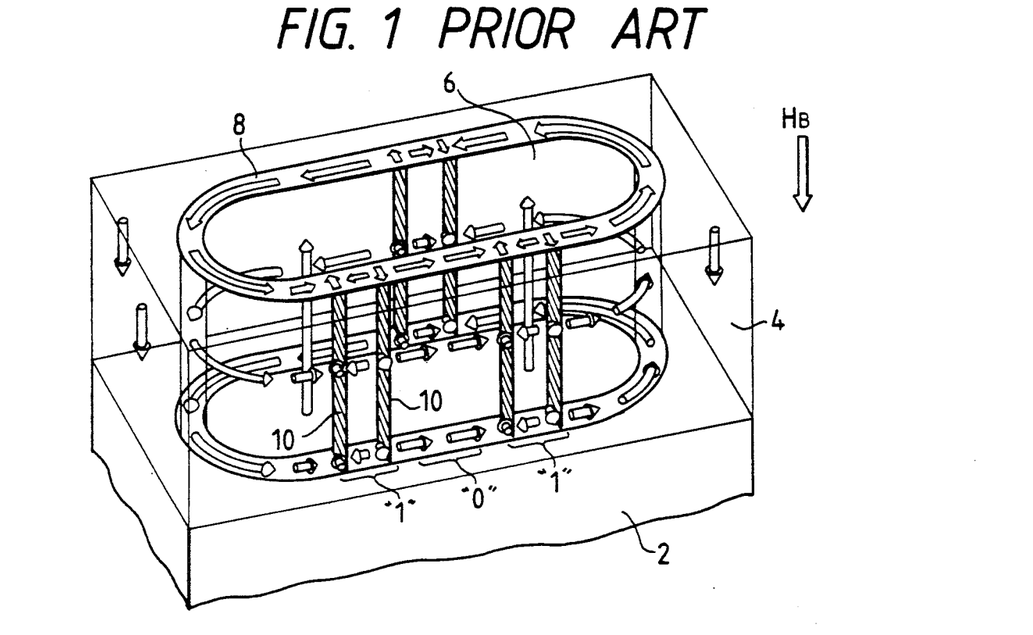
FIG. 1 shows a schematic perspective view of a magnetic structure of a Bloch line memory.

FIG. 1 shows a schematic perspective view of a magnetic material structure of a Bloch line memory.

In FIG. 1, numeral 2 denotes a substrate made of non-magnetic garnet such as GGG or Nd GG, and a magnetic garnet thin film 4 is applied on the substrate. The film 4 may be formed by a liquid phase epitaxial growth method (LPE method), and a thickness thereof may be 5 μm. Numeral 6 denotes a stripe magnetic domain formed in the magnetic garnet thin film 4. A magnetic wall 8 is formed as a boundary to other area of the magnetic domain 6. A width of the stripe magnetic domain 6 may be 5 μm and a length thereof may be 100 μm. A thickness of the magnetic wall 8 may be 0.5 μm. As shown by arrows, a direction of magnetization in the magnetic domain 6 is upward, and a direction of magnetization outside of the magnetic domain 6 is downward.

A direction of magnetization in the magnetic wall 8 twists from an inner surface (facing the magnetic domain 6) to an outer surface. The direction of twist is reversed with respect to a perpendicular Bloch line 10 in the magnetic wall 8. In FIG. 1, the direction of magnetization at a thicknesswise center of the magnetic wall 8 is shown by arrows, and the direction of magnetization in the Bloch line 10 is shown in a similar manner.

An external downward biasing magnetic field $H_B$ is applied to the magnetic material structure.

As shown, there are two different directions of magnetization in the Bloch line 10, and presence and absence of a pair of such Bloch lines correspond to information "1" and "0", respectively. The Bloch line pair is in a potential well periodically formed in the magnetic wall 8. By applying a pulsive magnetic field normal to the substrate plane, the Bloch line pair is sequentially transferred to adjacent potential well. Thus, recording of information into the Bloch line memory (writing of a Bloch line pair into the magnetic wall 8) and reproduction of information recorded in the Bloch line memory (reading of the Bloch line pair from the magnetic wall 8) can be effected at predetermined positions while the Bloch line pairs are transferred in the magnetic wall 8. The recording and reproduction of the information are done by applying a pulsive magnetic field of a predetermined strength normal to the substrate plane at an edge of the stripe magnetic domain 6. While not shown in FIG. 1, a conductor pattern for applying the pulse is formed on the surface of the magnetic thin film 4 with a predetermined positional relationship to the stripe magnetic domain 6, as pulsive magnetic field application means for recording and reproducing information.

In the above Bloch line memory, the potential well for the Bloch line pair is formed by applying a periodic and regular pattern to the surface of the magnetic thin film so that the pattern crosses the magnetic wall.

Figure 2:
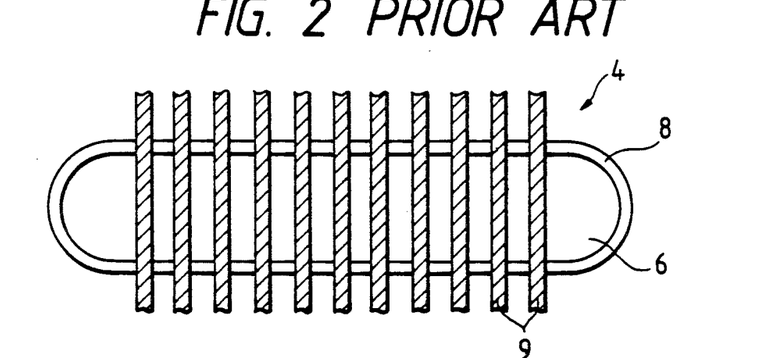
FIG. 2 shows a partial plan view of a prior art Bloch line memory illustrating a pattern for forming potential wells.

FIG. 2 shows a partial plan view of a Bloch line memory illustrating such a pattern.

In FIG. 2, a number of line patterns 9 extending to cross the stripe magnetic domain 6 are arranged in parallel to each other on the surface of the magnetic thin film 4. The pattern comprises a conductive layer such as Cr, Al, Au or Ti, has a width of 0.5 μm and a pitch of 1 μm. Because of magnetic distortion due to the formation of the patterned conductive layer, the potential wells can be formed in the magnetic wall 8 with periodic and regular arrangement. The pattern 9 may be a magnetic material layer, or the magnetic thin film 4 having H-ions, He-ions or Ne-ions implanted into the vicinity of the surface thereof. The potential wells formed by those patterns are symmetric with respect to the direction of transfer of the Bloch line.

Figure 3:
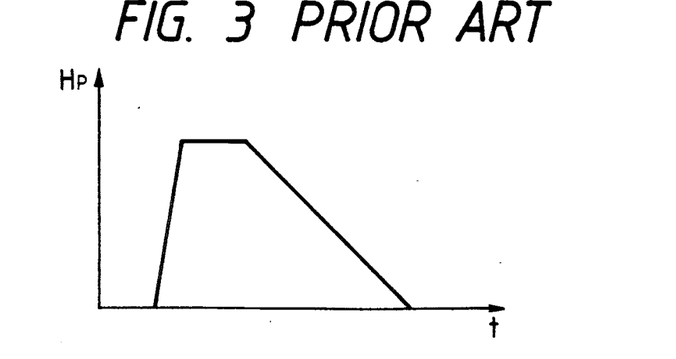
FIG. 3 shows a waveform of a pulsive magnetic field used in the transfer of the Bloch line in the prior art system.

The Bloch line is transferred by applying the pulsive magnetic field normally to the film plane of the magnetic thin film 4 and transferring the Bloch line to the adjacent potential well by utilizing a precessional movement of the magnetization generated by the pulsive magnetic field. If a simple square pulsive magnetic field is used as the pulsive magnetic field for the potential well, the Bloch line cannot be stably moved in a specified direction. Thus, as shown in FIG. 3, a pulsive magnetic field having a falling time which is sufficiently longer than a rising time is used as the pulsive magnetic field Hp for transferring the Bloch line in order to assure reversible transfer in the specified direction.

As a result, an electric circuit for generating the pulsive magnetic field is more complex than that used to generate the square pulsive magnetic field, and it is difficult to increase a transfer speed because of long falling time. Further, a power consumption increases.

SUMMARY OF THE INVENTION

It is an object of the present invention to provide an improved method for transferring a Bloch line by using a symmetric square pulsive magnetic field.

In order to achieve the above object, the present method for transferring the Bloch line present in the magnetic wall of the magnetic domain formed in the magnetic thin film, along the magnetic wall is characterized by the steps of forming a predetermined stress distribution along the magnetic wall in the magnetic thin film, positioning the Bloch line to a predetermined position in the magnetic wall in accordance with the stress distribution, and applying a pulsive magnetic field normally to a film plane of the magnetic thin film in synchronism with the formation of the stress distribution. The Bloch line is transferred from the predetermined position to another position by the stress distribution formation step and the magnetic field application step.

Other features and specific forms of the present invention will be discussed in detail below.

DESCRIPTION OF THE PREFERRED EMBODIMENTS

Figure 4:
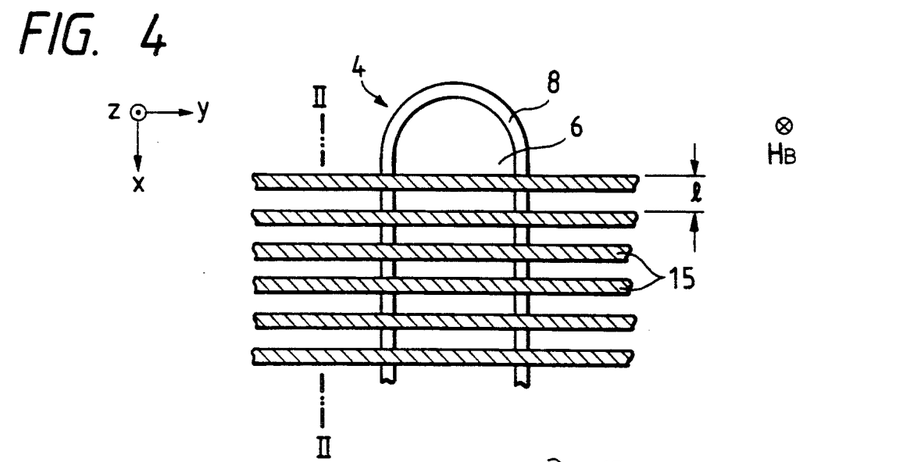
FIG. 4 shows a partial plan view of a Bloch line memory which uses the transfer method of the present invention.
Figure 5:
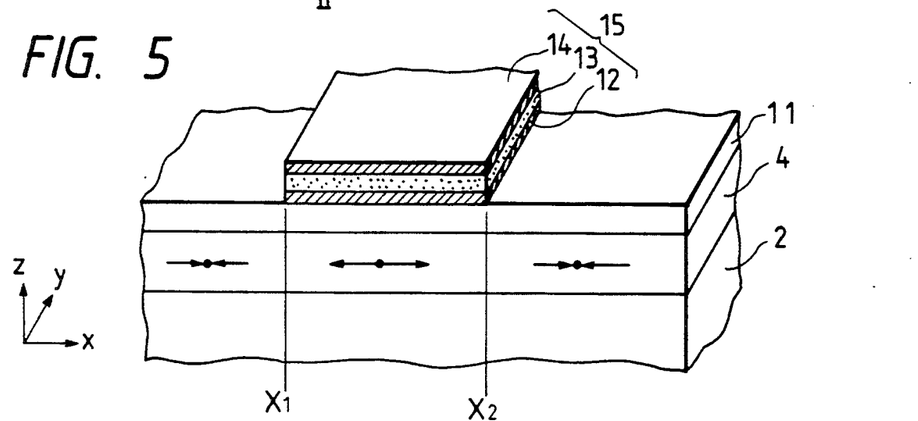
FIG. 5 shows a perspective view of a section taken along a line II—II of FIG. 4, of the Bloch line memory shown in FIG. 4, FIGS. 6A and 6B show X-axis stress and Y-axis stress in a magnetic thin film.

FIG. 4 shows a partial plan view of a first embodiment of a Bloch line memory which uses the transfer method of the present invention, and FIG. 5 shows a perspective view of a section taken along a line II—II of FIG. 4.

In those drawings, numeral 2 denotes a nonmagnetic garnet substrate, and numeral 4 denotes a magnetic garnet thin film. A magnetic domain 6 having a stripe planar shape is formed in the magnetic garnet thin film. Numeral 8 denotes a magnetic wall around the stripe magnetic domain 6. $H_B$ denotes a downward biasing magnetic field for forming the stripe magnetic domain 6. Those are similar to those explained in connection with FIG. 1.

A spacing layer 11 is applied to the surface of the magnetic thin film 4, and linear stress generation patterns 15 extending along Y-axis across the stripe magnetic domain 6 and the magnetic wall 8 are arranged in parallel to each other at a pitch l longitudinally (X-axis direction) of the stripe magnetic domain 6. In FIG. 4, the spacing layer 11 is not shown. As shown in FIG. 5, the stress generation pattern 15 has a first electrode layer 12 formed on the spacing layer 11, a piezoelectric layer 13 formed on the electrode layer 12 and a second electrode layer 14 formed on the piezoelectric layer 13. Voltage application means (not shown) is connected to the electrode layers 12 and 14 so that a pulse voltage is applied across the electrode layers 12 and 14 to contract the stress generation pattern 15 in the X-axis direction for a predetermined time.

The spacing layer 11 may be made of $SiO_2$ or polyimide resin, and a thickness thereof may be approximately 0.5 μm. The spacing layer has a function to adjust a stress generated in the magnetic thin film 4 by the stress generation pattern 15.

The piezoelectric layer 13 may be made of $AlN_x$ or $BaTiO_3$, and a thickness thereof may be approximately 0.5 μm. The electrode layers 12 and 14 may be made of Al, Au, Cr or W, and a thickness thereof may be approximately 0.5 μm.

The width of the linear stress generation pattern 15 may be approximately 0.5 μm and the arrangement pitch l may be approximately 1 μm.

The stress generation pattern 15 may be formed by well-known thin film deposition method or photolithography technique. In the present embodiment, when the piezoelectric layer 13 of the stress generation pattern 15 is formed, the materials and thicknesses of the piezoelectric layer and electrodes and the pattern shape are set so that a tensile stress is generated in the magnetic thin film 4 under the pattern 15, that is, the portions of the magnetic domain 6 and the magnetic wall 8 which the pattern 15 crosses. Thus, as shown in FIG. 5, a tensile stress is generated below the stress generation pattern 15 (between $x_1$ and $x_2$) in the magnetic thin film 4, and a compression stress is generated below the opposite adjacent portions of the pattern 15 along the x-direction. This stress is an initial stress which is generated even when a drive voltage is not applied across the electrodes 12 and 14 of the stress generation pattern 15.

Figure 6A:
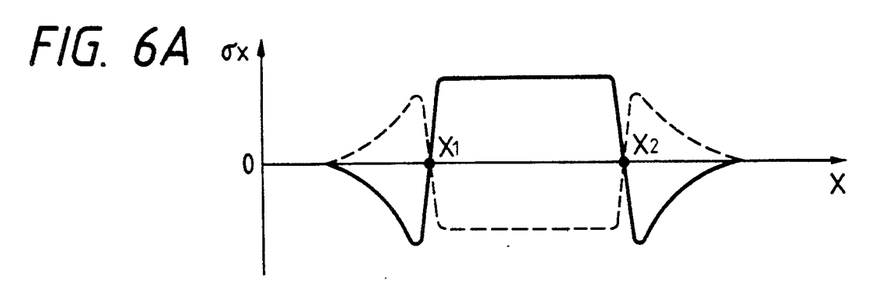
Figure 6B:
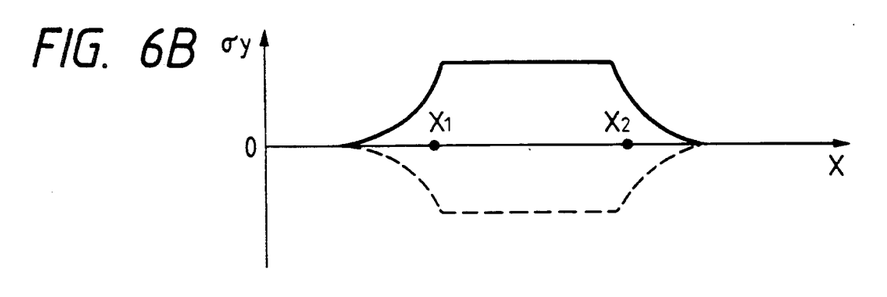

In the present embodiment, a direction which is parallel to a projection of the magnetic thin film 4 to a plane [111] in a direction [011] is the y-direction, and the direction of the stress generation pattern is the y-direction. The longitudinal direction of the stripe magnetic domain 6 is the x-direction. FIGS. 6A and 6B show distributions of x-axis stress $\sigma_x$ and y-axis stress $\sigma_y$ in the magnetic thin film 4 in a section (x-z plane) of FIG. 5. In those graphs, tensile stresses are positive and compression stresses are negative.

An initial stress generated in the magnetic thin film 4 by the formation of the stress generation pattern 15 is shown by a solid line in the graph. The initial stress along the x-axis abruptly changes from the tensile stress to the compression stress at an edge ($x_1$, $x_2$) of the pattern 15. On the other hand, the initial stress along the y-axis gently changes to zero as the tensile stress at the edge of the pattern 15.

In the magnetic thin film 4, an anisotropy constant $K_x^\sigma$ of an x-axis magnetic anisotropy generated by the x-axis stress $\sigma_x$ by a reverse magnetostrictive effect, and an anisotropy constant $K_y^\sigma$ of a y-axis magnetic anisotropy generated by the y-axis stress $\sigma_y$ by the reverse magnetostrictive effect are expressed by:

$$K_x^\sigma = -(3/2)\lambda_{111} \cdot \sigma_x$$

$$K_y^\sigma = -(3/2)\lambda_{111} \cdot \sigma_y$$

where $\lambda_{111}$ is a magnetostriction constant of the magnetic thin film 4 in a [111] direction.

In the present embodiment, $\lambda_{111}$ is negative.

Figure 7:
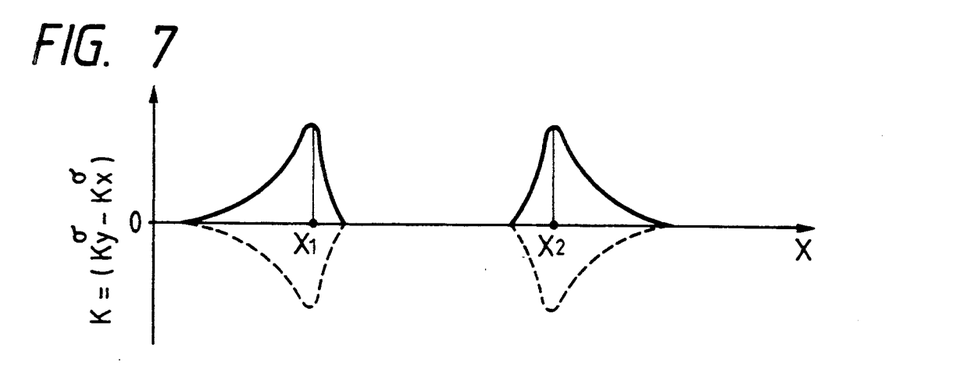
FIG. 7 shows magnetic anisotoropy in the magnetic thin film.

FIG. 7 shows a graph of interplane anisotropy constant $K = (K_y^\sigma - K_x^\sigma)$ In FIG. 7, K for the initial stress is shown by a solid line.

In the present embodiment, since the longitudinal direction of the stripe magnetic domain 6 is along the x-axis, the orientation of the Bloch line in the magnetic wall 8 is along the y-axis. Accordingly, the larger is the positive K value is, the smaller is the magnetic wall energy in the area in which the Bloch line exists so that the Bloch line can stay stable. If only the initial stress is applied, the positions $X_1$, $X_2$ are stable positions (potential well) of the Bloch line.

When the stress generation pattern 15 is driven and a voltage Ep is applied to the piezoelectric layer 13, the piezoelectric member is contracted and the stress distribution in the magnetic thin film 4 changes. As a result, a reverse stress is generated in the magnetic thin film 4 to cancel the initial stress. The x-axis stress $\sigma_x$ and the y-axis stress $\sigma_y$ are shown by broken lines in FIGS. 6A and 6B. K is shown by a broken line in FIG. 7. As seen from FIG. 4, the stress distribution is reversed and positions $X_1$ and $X_2$ which were stable positions of the Bloch line 7 at the initial stress application are now unstable positions of the Bloch line because K becomes negative.

Figure 8:
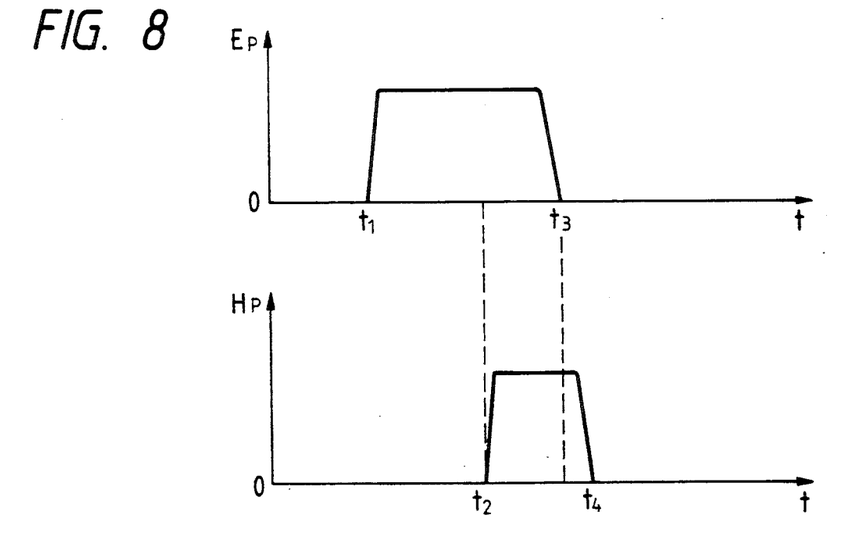
FIG. 8 shows a drive timing in the transfer of the Bloch line in accordance with the present invention.

FIG. 8 shows a drive timing of the stress generation means and pulsive magnetic field generation means when the Bloch line is transferred in the present embodiment.

As shown, the drive voltage Ep for the stress generation pattern 15 is a pulse which rises at a time $t_1$ and falls at a time $t_3$, and the pulsive magnetic field Hp applied by the pulsive magnetic field generation means in the z-axis direction (i.e., normally to the film plane of the magnetic thin film 4 is a pulse which rises at a time $t_2$ which is after the time $t_1$ and before the time $t_3$ and falls at a time $t_4$ which is after the time $t_3$. Thus, between the time $t_1$ and the time $t_3$, the Bloch lines at the positions $X_1$ and $X_2$ are unstabilized, and after the time $t_3$, the positions $X_1$ and $X_2$ are again rendered stable positions for the Bloch lines. Between the time $t_2$ and the time $t_4$, the pulsive magnetic field is applied to more the Bloch line by a gyro effect in a specified direction along the magnetic wall 6. The magnitude of the magnetic field Hp and the time period $t_2$–$t_3$ are set such that the displacement of the Bloch lines is larger than the arrangement pitch 1 of the pattern 15 and smaller than 21. As a result, the Bloch line is moved oppositely to the movement at the rise of the pulsive magnetic field Hp and the Bloch line is trapped at a stable position (potential well) which is one ahead of the original position. By repeating the above operation, the Bloch line is transferred in the specified direction by a desired distance.

In the present embodiment, since the potential well for stabilizing the Bloch line position cannot prevent the movement of the Bloch line at the start of application of the pulsive magnetic field Hp, stable Bloch line transfer is attained at high speed and high efficiency even if the magnitude of the pulsive magnetic field is small.

In the present embodiment, the pulsive magnetic field Hp may be a substantially square pulse. Thus, the transfer speed is improved and a drive circuit for generating the pulse is simplified and a power consumption is small.

Figures 9, 10:
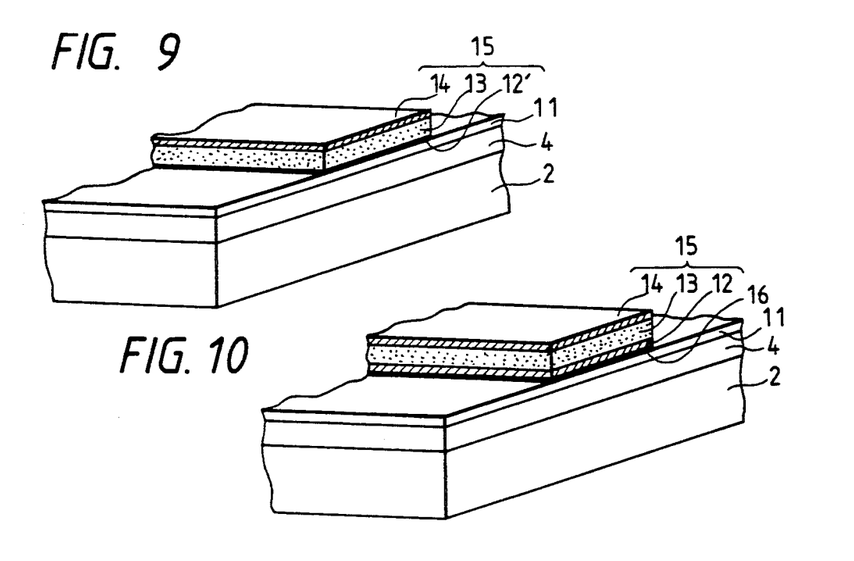
FIGS. 9 and 10 show partial sectional perspective views of another embodiment of the Bloch line memory which uses the transfer method of the present invention.

FIG. 9 shows a partial sectional perspective view of a second embodiment of the Bloch line memory which uses the transfer method of the present invention. In FIG. 9, the like elements to those shown in FIGS. 4 and 5 are designated by the like numerals.

The present embodiment is different from the first embodiment in that one electrode layer 12' of the stress generation means is made of a material which applies an effective initial stress to the magnetic thin film 4. The material of the electrode layer 12' in the present embodiment may be Cr, W, Ti, Pt or Mo.

In accordance with the present embodiment, since the initial stress is generated at a position closer to the magnetic thin film 4, a stress application efficiency is high and a potential well which is deep enough to trap the Bloch line is easily attained.

FIG. 10 shows a partial sectional perspective view of a third embodiment of the Bloch line memory which uses the transfer method of the present invention. In FIG. 10, the like elements to those shown in FIGS. 4 and 5 are designated by the like numerals.

The present embodiment is different from the first embodiment in that an initial stress generation layer 16 for applying a large initial stress to the magnetic thin film 4 is provided between the stress generation pattern 15 and the spacing layer 11. A material of the initial stress generation layer 16 in the present embodiment may be Si, $O_2$ or C.

In the present embodiment, since a large initial stress is generated at a position close to the magnetic thin film 4, the stress application efficiency is high.

In the present embodiment, a tensile stress is generated as the initial stress at the position of the magnetic thin film corresponding to the stress generation pattern 15. Alternatively, a compression stress may be generated. In this case, the stress generation pattern 15 generates a tensile stress when it is driven.

In the present embodiment, the initial stress is present when the stress generation means is not activated so that an energy required to drive the stress generation means may be small. In the present embodiment, the initial stress may also be generated by the stress generation means. This may be attained in the present embodiment by reversing the polarity of the voltage applied to the piezoelectric layer.

By generating the stress in the magnetic thin film by the stress generation means and applying the pulsive magnetic field to the magnetic thin film by the magnetic field application means in connection with the generation of the stress, stable Bloch line transfer is attained at high speed and high efficiency even if the magnitude of the pulsive magnetic field is small.

In accordance with the present embodiment, the pulsive magnetic field may be a substantially square pulse. Thus, the transfer speed is improved and the drive circuit for generating the pulse is simplified and the power consumption is reduced.

Figure 11:
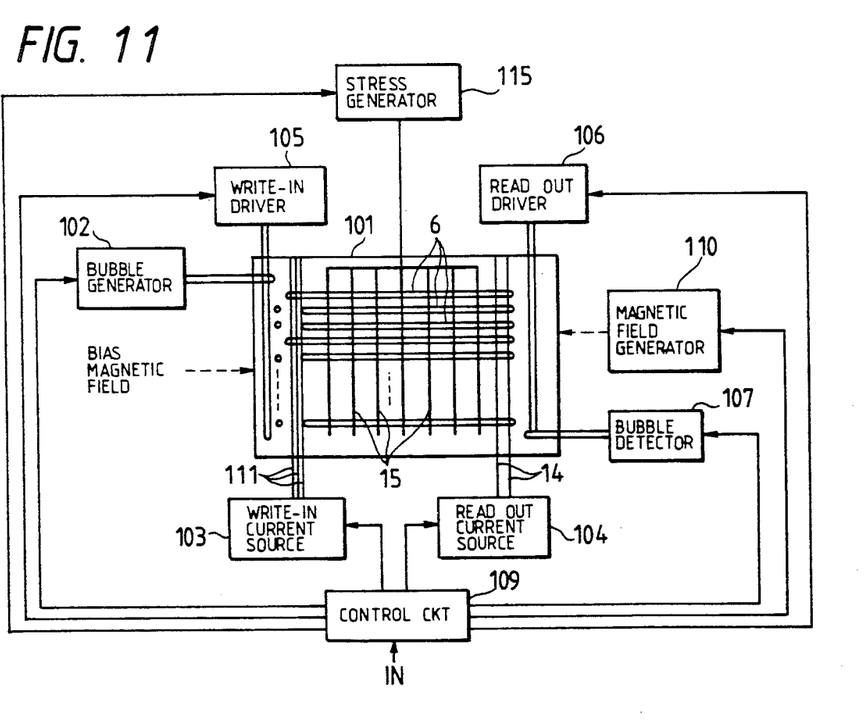
FIG. 11 shows a block diagram of a magnetic memory device which transfers a Bloch line by using the transfer method of the present invention.

FIG. 11 shows a block diagram of a magnetic memory device which transfers the Bloch line which is an information carrier by utilizing the transfer method of the present invention to read and write information.

In FIG. 11, numeral 101 denotes a Bloch line memory substrate on which a plurality of stripe magnetic domains 6 are arranged at a predetermined pitch orthogonally to the longitudinal direction of the stripe magnetic domains 6. Stress generation patterns 15 are arranged on the stripe magnetic domains 6 at a predetermined pitch in the longitudinal direction of the stripe magnetic domains 6. Potential wells are formed by the patterns 15 at a predetermined pitch along the magnetic walls of the stripe magnetic domains 6, and Bloch lines are distributed along the potential wells. Recording information is stored as a time sequence signal represented by the distribution of the Bloch lines.

Numeral 102 denotes a magnetic bubble generator which time-serially generates magnetic bubbles in accordance with input information. The time-serially generated magnetic bubble are sequentially transferred to leading edge positions of the corresponding stripe magnetic domains 6 by a write-in driver 105. Those magnetic bubbles are used to write the Bloch lines.

Numeral 106 denotes a read out driver which converts the Bloch lines to magnetic bubbles to reproduce the information and transfer the magnetic bubbles to a bubble detector 107.

The bubble detector 107 sequentially detects the magnetic bubbles transferred from the read out driver 106 by utilizing a magneto-resistive effect to produce a time serial electrical signal representing the recording information.

Numeral 103 denotes a write in current source for supplying a current to a write conductor 111 when the Bloch line is written to a leading edge of each of the stripe magnetic domains 6, and numeral 104 denotes a read out current source for supplying a current to a read conductor 114 when the Bloch line at the leading edge of each of the stripe magnetic domain 6 is read.

Numeral 110 denotes a magnetic field generator for generating a pulsive magnetic field perpendicular to the film plane of the thin magnetic film. Numeral 115 denotes a stress generator connected to the electrodes of the stress generation patterns 15 through signal lines. A desired stress distribution is formed in the magnetic thin film of the substrate by applying the voltage to each of the electrodes. In the present embodiment, a pulse voltage is applied to each electrode to reverse the initial stress distribution formed in the magnetic thin film in accordance with the patterns 15.

Numeral 109 denotes a control circuit which controls the drivers 105 and 106, generators 102, 110 and 115, detector 107 and current sources 103 and 104 in accordance with the input signal (IN).

In the magnetic memory device of FIG. 11, a method for forming the Bloch lines in the magnetic walls at the leading edges of the stripe magnetic domains 6 and a method for converting the Bloch lines at the leading edges of the stripe magnetic domains 6 to the magnetic bubbles are described in detail in U.S. Pat. No. 4,583,200. Accordingly, the explanation thereof is omitted herein.

The control circuit 109 has a timing controller which controls an input timing of the control signal to the magnetic field generator 110 and the stress generator 115. In the present embodiment, the magnetic field generator 110 and the stress generator 115 are controlled such that the pulsive stress and the pulsive magnetic field are generated at the timing shown in the previous embodiment. By the pulsive stress and the pulsive magnetic field, the Bloch lines in the potential wells formed by the initial stress distribution by the stress generation patterns 15 are sequentially transferred to the adjacent potential wells.

The potential wells are formed along the magnetic walls of the stripe magnetic domains 6 at a constant pitch except for the opposite ends (leading edges) of the stripe magnetic domains 6. The Bloch lines are moved along the magnetic walls around the stripe magnetic domains 6.

The transfer of the Bloch lines by the magnetic field generator 110 and the stress generator 115, and the writing of the Bloch lines by the write conductor 111 or reading of the Bloch line by the read conductor 114 are effected in synchronism with the control circuit 109. By transferring the Bloch lines by the transfer method of the present invention, the Bloch lines can be moved at a higher speed and the information recording/reproducing speed is significantly improved.

We claim:

1. A Bloch line memory for recording information by using a Bloch line in a magnetic wall of a magnetic domain in a magnetic thin film comprising:
    stress generating means for generating a stress distribution in the magnetic thin film along the magnetic wall, and for changing said stress distribution; and
    magnetic field application means for applying a pulsive magnetic field perpendicularly to the surface of the magnetic thin film;
    said stress generation means and said magnetic field application means cooperating to transfer the Bloch line along the magnetic wall.

2. A Bloch line memory according to claim 1 wherein said stress generation means includes a piezoelectric element and a pair of electrodes for applying a voltage to said piezoelectric element.

3. A Bloch line memory according to claim 2, wherein the stress generating means further includes a predetermined stress generating layer provided between said magnetic thin film and one of said pair of electrodes which is closer to said magnetic thin film than the other of said electrodes.

4. A Bloch line memory according to claim 1 wherein said magnetic field application means applies a pulsive magnetic field having a symmetric waveform to said magnetic thin film.

5. A Bloch line memory according to claim 1 wherein said stress generation means and said magnetic field application means cooperatively act to said magnetic thin film.

6. A Bloch line memory according to claim 5 wherein said stress generation means and said magnetic field application means generates pulsive stress and magnetic field, respectively, a rise time of the pulse of said stress generation means is earlier than a rise time of the pulse of said magnetic field application means, the rise time of the pulse of said magnetic field application means is earlier than a fall time of the pulse of said stress generation means, and a fall time of the pulse of said magnetic field generation means is later than the fall time of the pulse of said stress generation means.

7. A method for transferring a Bloch line along a magnetic wall of a magnetic domain formed in a magnetic thin film, comprising the steps of:
forming a predetermined stress distribution in the magnetic thin film along the magnetic wall;
changing the stress distribution; and
applying a pulsive magnetic field perpendicularly to the surface of the magnetic thin film in synchronism with said changing step to move the Bloch line.

8. A method for transferring a Bloch line according to claim 7 wherein said changing step includes a step to reverse the predetermined stress distribution.

9. A method for transferring a Bloch line according to claim 7 wherein a start time and end time of said changing step are earlier than a start time and an end time of said applying step, respectively, and the start time of said applying step is earlier than the end time of said changing step.

10. A method for transferring a Bloch line along a magnetic wall of a magnetic domain formed in a magnetic thin film, comprising the steps of:
changing a stress distribution in the magnetic domain; and
applying a pulsive magnetic field substantially perpendicularly to the surface of the magnetic thin film in synchronism with the change of the stress distribution.

11. A device for transferring a Bloch line along a magnetic wall of a magnetic domain formed in a magnetic thin film, comprising:
changing means for changing a stress distribution of the magnetic domain;
applying means for applying a pulsive magnetic field substantially perpendicularly to a surface of the magnetic thin film; and
control means for controlling said changing means and said applying means to move the Bloch line.

12. A device according to claim 11, wherein said applying means applies a pulsive magnetic field having a symmetric waveform.

13. A method according to claim 10, wherein the pulsive magnetic field of said applying step has a symmetric waveform.

14. A method of transferring a Bloch line from a first position to a second position in a magnetic wall of a magnetic domain formed in a magnetic thin film, potential wells being formed at the first and second positions by a stress distribution formed along the magnetic well whereby the Bloch line is positioned at the first position, the method comprising the steps of:
applying a pulsive magnetic field substantially perpendicularly to a surface of the magnetic thin film while reversing the stress distribution, whereby the Bloch line is moved from the first position; and
reversing again the stress distribution to form the potential well at the second position whereby the Bloch line is transferred to the second position.

15. A method according to claim 14, wherein the pulsive magnetic field comprises a pulse having a symmetric waveform.

16. A method for transferring a Bloch line according to claim 14 wherein said applying step starts after the step of reversing the stress distribution and wherein said applying step ends after the step of reversing again the stress distribution.

17. A device for transferring a Bloch line from a first position to a second position in a magnetic wall of a magnetic domain formed in a magnetic thin film, wherein potential wells are formed at the first and second positions by a stress distribution formed along the magnetic wall, the device comprising:
stress distribution forming means for forming the stress distribution, said forming means being provided on the magnetic thin film and arranged to reverse and re-reverse the stress distribution;
applying means for applying a pulsive magnetic field substantially perpendicularly to the magnetic thin film; and
control means for controlling said stress distribution forming means and said magnetic field applying means for applying the pulsive magnetic field while reversing the stress distribution, whereby the Bloch line is moved from the first position, and for re-reversing the stress distribution, whereby the Bloch line is transferred to the second position.

18. A method according to claim 14, wherein the pulsive magnetic field comprises a substantially rectangular pulse having a symmetric waveform.

19. A method according to claim 18, wherein said control means controls said stress distribution forming means and said magnetic field applying means to start the application of the pulsive magnetic field after the reversal of the stress distribution and to end the application of the pulsive magnetic field after re-reversal of the stress distribution.

20. A method of transferring a Bloch line along a magnetic wall of a magnetic domain formed in a magnetic thin film comprising:
forming a potential well for trapping the Bloch line at a first position by a stress distribution formed along the magnetic wall; and
applying a pulsive magnetic field substantially perpendicularly to a surface of the magnetic thin film while reversing the stress distribution formed along the magnetic wall, whereby the Bloch line is transferred from the first position to a second position.

* * * * *

UNITED STATES PATENT AND TRADEMARK OFFICE
CERTIFICATE OF CORRECTION

PATENT NO. : 5,138,571
DATED : August 11, 1992
INVENTOR(S) : TAKEO ONO, ET AL.

It is certified that error appears in the above-identified patent and that said Letters Patent is hereby corrected as shown below:

COLUMN 3

Line 59, "wells." should read --wells,--.

COLUMN 4

Line 3, "anisotoropy" should read --anisotropy--.

COLUMN 5

Line 47, "is" (second occurrence) should be deleted.

COLUMN 6

Line 15, "more" should read --move--.

COLUMN 7

Line 47, "bubble" should read --bubbles--.
    Line 66, "domain 6" should read --domains 6--.

UNITED STATES PATENT AND TRADEMARK OFFICE
CERTIFICATE OF CORRECTION

PATENT NO. : 5,138,571

DATED : August 11, 1992

INVENTOR(S) : TAKEO ONO, ET AL.

Page 2 of 3

It is certified that error appears in the above-identified patent and that said Letters Patent is hereby corrected as shown below:

COLUMN 8

Line 17, "t he" should read --the--.
Line 62, "claim 1" should read --claim 1,--.

COLUMN 9

Line 4, "claim 1" should read --claim 1,--.
Line 8, "claim 1" should read --claim 1,--.
Line 12, "claim 5" should read --claim 1,--.
Line 15, "generates" should read --generate--.
Line 36, "claim 7" should read --claim 7,--.
Line 39, "claim 7" should read --claim 7,--.

COLUMN 10

Line 22, "claim 14" should read --claim 14,--.

UNITED STATES PATENT AND TRADEMARK OFFICE
CERTIFICATE OF CORRECTION

PATENT NO. : 5,138,571

DATED : August 11, 1992

INVENTOR(S) : TAKEO ONO, ET AL.                 Page 3 of 3

It is certified that error appears in the above-identified patent and that said Letters Patent is hereby corrected as shown below:

SHEET 4/4

FIG. 11, "READ OUT" (both occurrences)
           should read --READ-OUT--.

Signed and Sealed this

Twelfth Day of October, 1993

Attest:

BRUCE LEHMAN

Attesting Officer      Commissioner of Patents and Trademarks